(12) United States Patent
Miyashita et al.

(10) Patent No.: US 7,396,591 B2
(45) Date of Patent: Jul. 8, 2008

(54) WIRING SUBSTRATE

(75) Inventors: Takuya Miyashita, Tokyo (JP); Masafumi Okada, Tokyo (JP); Kenji Matsumoto, Tokyo (JP)

(73) Assignee: Japan Aviation Electronics Industry Limited, Tokyo (JP)

( * ) Notice: Subject to any disclaimer, the term of this patent is extended or adjusted under 35 U.S.C. 154(b) by 57 days.

(21) Appl. No.: 11/454,412

(22) Filed: Jun. 16, 2006

(65) Prior Publication Data

US 2006/0292354 A1    Dec. 28, 2006

(30) Foreign Application Priority Data

Jun. 22, 2005  (JP)  ............... 2005-182130

(51) Int. Cl.
*B32B 3/00*  (2006.01)
(52) U.S. Cl. .................. 428/458; 428/209; 174/251; 174/259
(58) Field of Classification Search ........ 428/209, 428/901, 458; 174/255–258, 251, 259
See application file for complete search history.

(56) References Cited

U.S. PATENT DOCUMENTS

| | | | | |
|---|---|---|---|---|
| 4,472,465 A | * | 9/1984 | Burrill | 427/387 |
| 4,521,461 A | * | 6/1985 | McVie et al. | 427/387 |
| 4,788,106 A | * | 11/1988 | Short | 428/447 |
| 5,270,082 A | * | 12/1993 | Lin et al. | 427/539 |
| 5,763,058 A | * | 6/1998 | Isen et al. | 428/209 |
| 6,426,143 B1 | * | 7/2002 | Voss et al. | 428/378 |

FOREIGN PATENT DOCUMENTS

| | | |
|---|---|---|
| JP | 08-222839 | 8/1996 |
| JP | 2002-109997 | 4/2002 |

* cited by examiner

*Primary Examiner*—Cathy F. Lam
(74) *Attorney, Agent, or Firm*—David N. Lathrop; Gallagher & Lathrop

(57) ABSTRACT

In a wiring substrate having a metal wiring pattern that is formed on a substrate and includes a contact portion for providing connection to an external element, an organic thin film containing silane is formed to cover the metal wiring pattern and the contact portion is electrically connected to the external element through the organic thing film. Unlike conventional wiring substrates in which a contact portion is uncovered by ripping open or cutting away a protective resin film formed on the contact portion, the wiring substrate can be electrically connected with an external element having a low contact pressure, for example.

4 Claims, 3 Drawing Sheets

TABLE 1

| THICKNESS OF ORGANIC THIN FILM (μm) | 0.5 | 1.2 | 3.1 | 4.9 | 6.5 | 8.0 |
|---|---|---|---|---|---|---|
| WIRING RESISTANCE (Ω) | 2 | | | | 100M OR HIGHER | |
| INTERLINE INSULATION RESISTANCE (Ω) | 100M OR HIGHER | | | | | |

TABLE 2

| SAMPLE NO. | A | B | C | D | E | F |
|---|---|---|---|---|---|---|
| SUBSTRATE MATERIAL | PET | Si | Si | Si | Si | Si |
| WIRING MATERIAL (WIRING METHOD) | Ag NANOPARTICLE DISPERSE INK (INK JET) | Ag NANOPARTICLE DISPERSE INK (INK JET) | Au (SPATTER) | Au (SPATTER) | Au (SPATTER) | Au (SPATTER) |
| ORGANIC THIN FILM (FIRING TEMPERATURE) | POLYESTER SILANE (200°C/1h) | POLYESTER SILANE (200°C/1h) | POLYESTER SILANE (200°C/1h) | POLYVINYL SILANE (100°C/1h) | POLYVINYL-BASE MATERIAL (100°C/1h) | POLYESTER-BASE MATERIAL (200°C/1h) |
| THICKNESS OF ORGANIC THIN FILM (μm) | 1.2 | 1.2 | 1.2 | 1.2 | 1.2 | 1.2 |
| WIRING RESISTANCE (Ω) | 2 | 2 | 1 | 1 | 100M OR HIGHER | 100M OR HIGHER |
| INORGANIC COMPONENT IN ORGANIC THIN FILM IN THE VICINITY OF WIRING | Ag | Ag | Au | Au | NONE | NONE |

FIG. 3

WIRING SUBSTRATE

The present invention relates to a wiring substrate having a wiring pattern formed thereon.

BACKGROUND ART

In wiring substrates having a metal wiring pattern formed thereon, the metal wiring pattern is typically coated with a resin coating or insulating film except a portion (contact portion) through which connection with an external element is provided. Whereas the wiring pattern is protected by the coating, the contact portion is exposed and therefore is susceptible to oxidization, corrosion due to exposure to humidity, and further to metal element migration, for example. As a result, problems such as a connection (contact) failure or shorting of adjacent wiring lines can occur.

To solve these problems, approaches to forming a protective film on the contact portion as well have been proposed in the past. For example, Patent literature 1 describes a protective resin film formed to a thickness that can be pierced through by a terminal of a mating connector to be connected. Patent literature 2 describes a fluorine resin thin film of such hardness that it can be cut away by a terminal of a mating connector to be connected.

As has been described, configurations have been used in which a protective resin film is formed on a contact portion to prevent problems such as migration. However, the protective resin film is ripped open or cut away when electrical connection is made. That is, the protective film in the connection portion is removed to expose the contact portion. The exposed contact portion is inevitably subject to development of corrosion. In addition, if the contact portion is repeatedly attached and detached to an external element, the exposed area widens and accordingly the effect of protection is significantly impaired.

Furthermore, because the protective resin film is ripped open or cut away when electrical connection is made, resin particles generated during the ripping or cutting may cause a contact failure.

Another problem is that an external element having a low contact pressure cannot be electrically connected in a reliable manner if the contact pressure is too low to rip open or cut away the protective film sufficiently deep or wide to ensure a reliable electrical connection.

Patent literature 1: Japanese Patent Application Laid-Open No. 2002-109997

Patent literature 2: Japanese Patent Application Laid-Open No. 8-222839

DISCLOSURE OF THE INVENTION

In light of these circumstances, an object of the present invention is to provide a wiring substrate that is capable of preventing oxidization, corrosion, and migration of a contact portion, is capable of being conductively connected with an external element having a low contact pressure, and is free of contact failures due to contamination during conductive connection which are inherent in conventional wiring substrates.

According to the present invention, an organic thin film containing silane is formed to cover a metal wiring pattern on a wiring substrate that includes a contact portion for external connection, and the contact portion is conductively connected to an external element through the organic thin film.

BRIEF DESCRIPTION OF THE DRAWINGS

FIG. 3 is a table showing results of evaluation and XMA analysis of samples fabricated using different types of organic thin films, substrate materials, and fabrication methods;

BEST MODE FOR CARRYING OUT THE INVENTION

An embodiment of the present invention will be described with respect to an example thereof.

[Example]

A wiring pattern was formed on an insulating substrate and an organic thin film was formed that covers the wiring pattern on the insulating substrate to fabricate a wiring substrate. A PET (polyethylene terephtalate) film was used as the material of the insulating substrate and Ag (silver) nanoparticle disperse ink was used as the material of the wiring. A polyester silane solution was used as the material of the organic thin film. The fabrication method will be described below in detail in order.

(1) Water-repellent finishing was applied to the surface of the PET film substrate as a preprocess for using Ag nanoparticle disperse ink to form a wiring pattern.

Figures 1, 2:
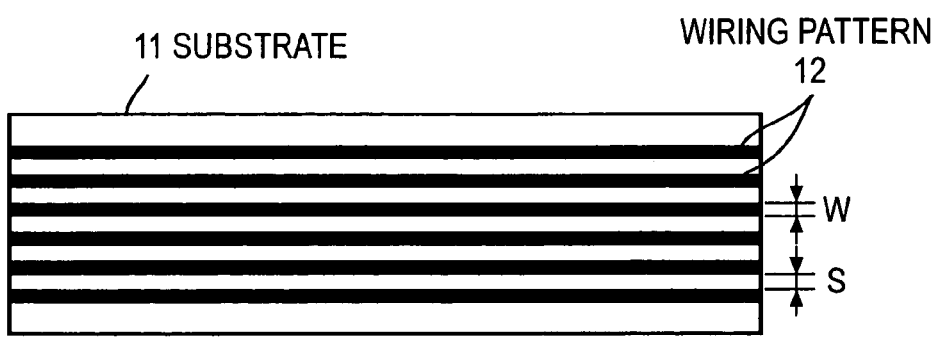
FIG. 1 is a plan view for illustrating a wiring pattern on an evaluation wiring substrate.
FIG. 2 is a table showing results of evaluation of the resistances of samples having organic thin films with different thicknesses.

(2) The Ag nanoparticle disperse ink was discharged onto the insulating substrate with a drawing dispenser to draw the wiring pattern. FIG. 1 shows a sample of the wiring substrate formed by drawing a wiring pattern 12 of six wiring lines on an insulating substrate 11. The insulating substrate 11 in this example was 3 mm wide (denoted by W), 10 mm long, and 0.2 mm thick. The wiring pattern 12 was 0.2 mm wide, 10 mm long, and 2 μm thick. Six wiring lines spaced 0.2 mm apart (denoted by S) were formed as the wiring pattern.

(3) The wiring pattern thus drawn was burnt at 200° C. for one hour to form an Ag wiring pattern.

(4) Polyester silane spray coating was applied over the insulting substrate with the Ag wiring pattern formed thereon and was burnt at 200° C. for one hour to form an organic thin film of polyester silane with a thickness of 1.2 μm.

<Evaluation of Resistance>

The wiring resistance and interline insulation resistance of the wiring substrate fabricated as described above were measured with a resistance meter. The measurement was conducted on the surface of the organic film, that is, through the organic thin film, with a load (i.e., contact pressure) of approximately 0.5 N. For comparison, another sample having an exposed Ag pattern without an organic thin film was provided and resistance evaluation is performed on it in the same way.

\* Sample with Organic Thin Film (Embodiment)

The six wiring lines showed a wiring resistance of 2Ω on average between opposite ends of the wiring lines and all showed an interline insulation resistance of higher than or equal to 100 MΩ.

*Sample without Organic Thin Film (Comparative Example)

The six wiring lines showed a wiring resistance of 2Ω on average and all showed an interline insulation resistance of higher than or equal to 100 MΩ.

The results show that the same wiring resistance can be obtained both in case of wiring with the organic thin film and in case of wiring without an organic thin film. That is, it can be seen from the results that the wiring lines covered with the organic thin film were in good electrical conduction through the organic thin film in this example. It was observed that the wiring pattern under the organic thin film in the measured position was not exposed (the organic thin film was not broken) after the measurement.

The interline insulation resistance was 100 MΩ or higher, which revealed that the adjacent wiring patterns were well insulated from each other.

<Corrosion Evaluation>

Migration testing was conducted on the wiring substrate with the organic thin film described above. The testing was conducted in an atmosphere with a relative humidity of 85% at 85° C. with a voltage of 5 V for 500 hours. The testing showed an excellent result, that is, both wiring resistance and interline insulation resistance were the same as those measured before the testing.

Thickness of Organic Thin Film

Wiring substrates having organic thin films with different thicknesses were fabricated in the same way as in the example described above and the wiring resistances and interline insulation resistances were measured. The results are shown in Table 1 of FIG. 2.

As shown in Table 1, the wirings with organic thin films having thicknesses of less than 5 μm had a wiring resistance of 2Ω. It is clear from the result that electrical conduction through organic thin films can be provided. On the other hand, it can be seen that the organic thin films having thicknesses of more than 5 μm had a wiring resistance of 100 MΩ or higher, and therefore electrical conduction is prevented because of insulation by these organic thin film. The interline insulation resistance was 100 MΩ or higher in all cases.

Type of Organic Thin Film and Materials of Substrate and Wiring

Various wiring substrate samples were fabricated using different types of organic thin films, substrate materials, wiring materials, and wiring methods, and their wiring resistances were measured. The wiring pattern is the same as that in the example describe above, which is shown in FIG. 1. Inorganic components in the organic thin films in the vicinity of the wiring pattern were analyzed using XMA. Table 2 in FIG. 3 shows the fabrication specifications and measurement results.

In sample A, a wiring pattern was drawn by using an inkjet apparatus instead of the drawing dispenser used in the example described above. Sample B is different from sample A in that Si (silicon) was used as the material of the substrate. Sample C was fabricated by using a wiring material and technique different from those used in Sample B. The wiring pattern of sample C was formed with a Au (gold) spatter. Samples D to F had organic thin films of different types from that of sample C.

From Table 2, the following can be said.

Electrical conduction can be provided through an organic thin film of polyester silane or polyvinyl silane. On the other hand, electrical conduction cannot be provided through organic films that do not contain silane.

Electrical conduction can be provided through the organic thin film in wiring of Au as well as Ag.

In the cases where organic thin films containing silane were formed, the metal elements of wiring materials were found in the organic thin films in the vicinity of the wiring pattern. On the other hand, no such metal element was found in organic thin films without silane.

From the foregoing, it can be considered that, if an organic thin film containing silane is formed on a wiring pattern, the metal element of the wiring material diffuses into the organic thin film and the diffusion of the metal element provides the organic thin film with electrical conductivity, enabling electrically conductive connection through the organic thin film. From the results shown in FIG. 1, the extent of the diffusion may be approximately 5 μm at a maximum and therefore such conductive connection is made possible by choosing the thickness of the organic thin film to be less than 5 μm.

Because of the extent of the diffusion, electrical conduction between adjacent wiring patterns through the organic thin film can be avoided by spacing adjacent wiring patterns 5 μm or more apart. That is, insulation between adjacent wiring patterns can be secured. Therefore, the present invention can be applied to even a wiring substrate having a wiring pattern with a very small pitch.

Figure 4:
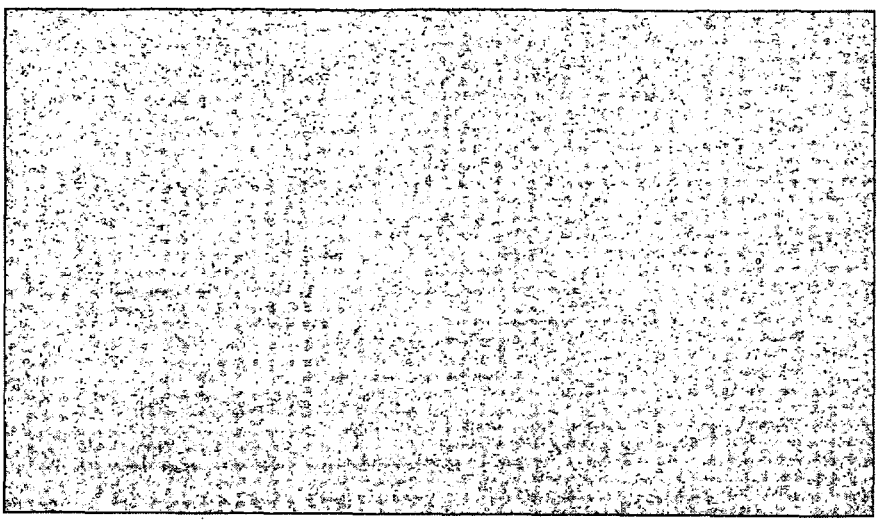
FIG. 4 is a photograph showing a surface condition of an organic thin film after measurement of the resistance of wiring.

FIG. 4 shows a photograph of the surface of a wiring substrate according to the present invention taken after the wiring resistance was measured to determine that the wiring is in a good electrical conduction. It can be seen from the photograph that the organic thin film in the measured portion is unchanged and the wiring pattern under the organic thin film is not exposed.

Figure 5:
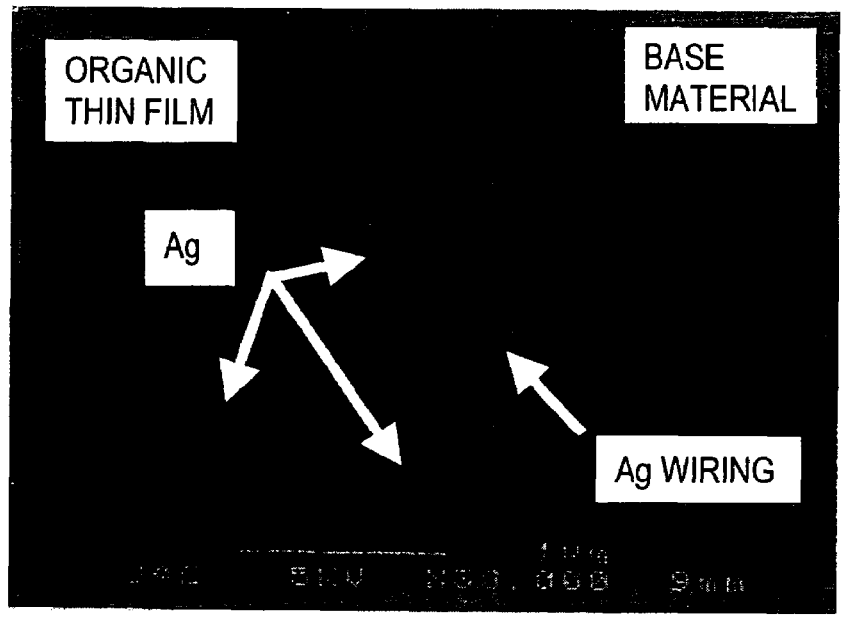
FIG. 5 is an SEM photograph showing an Ag component in an organic thin film subjected to SEM-XMA analysis.

FIG. 5 shows an example of an SEM photograph of a cross-section sample of a wiring substrate taken during SEM-XMA analysis of an inorganic component in the organic thin film. The wiring material in the sample used was Ag (approximately 0.5 μm thick) and the organic thin film was made of polyester silane (approximately 10 μm thick).

The XMA analysis revealed that an Ag component was contained in the organic thin film as shown in the photograph in FIG. 5.

As has been described above, a contact portion of a wiring substrate according to the present invention is covered with an organic thin film and thus oxidation, corrosion, and migration in the contact portion can be prevented.

Figure 6:
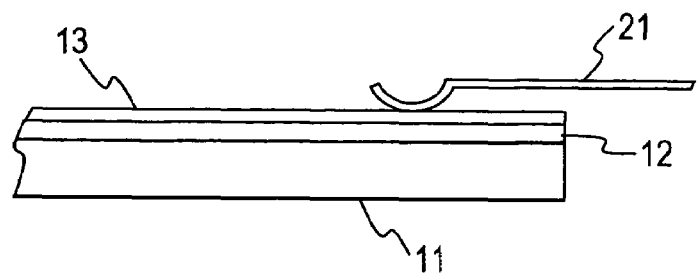
FIG. 6 shows a cross section of a wiring substrate taken along a wiring pattern on the wiring substrate shown in FIG. 1 and a terminal pin connected to the wiring pattern.

FIG. 6 shows an example of a cross section of a wiring pattern on an insulting substrate 11 along one wiring line and a terminal pin 21 of an external element such as a connector (not shown) that is contact-connected to the line. In this example, the metal terminal pin 21 is in elastic contact with the surface of an organic thin film 13 containing a silane and is in electrical conduction with a wiring pattern 12 formed on an insulating substrate 11 through the organic thin film 13. That is, the portion of the surface of the organic thin film 13 opposed to the wiring pattern 12 line is the point connected with the metal terminal pin 21.

Because the contact portion is conductively connected through the organic thin film in this way, the structure according to the present invention provides stable electric conduction, is not susceptible to contact failures that would be caused contamination, and can be provide good conductive connection with an external element with a low contact pressure such as 0.5 N, unlike conventional structures in which a protective film covering a contact portion is forcedly removed by contact in order to electrically connect the contact portion. The organic thin film containing silane used in the present invention is relatively hard and therefore does not break under a normal contact pressure for connecting with an element such as a connector.

Exemplary Application

An experiment was performed in which a connector terminal made of Cu (copper) is immersed in a polyester silane solution used in the example described above to form an organic thin film on the surface. The immersion time was one minute and the connector terminal was burnt at 150° C./h to form a polyester silane film. Conductivity evaluation of the connecter terminal showed electric conduction in the connecter terminal.

EFFECTS OF THE INVENTION

According to the present invention, oxidization, corrosion, and migration in a contact portion can be prevented because the metal wiring pattern, including the contact portion, is constructed to be covered with an organic thin film containing silane.

Furthermore, unlike in the conventional wiring substrates in which a contact portion is uncovered by ripping open or cutting away a protective resin film formed on the contact portion, the contact portion in the wiring substrate of the present invention can be electrically connected through the organic thin film, and therefore the contact portion cannot be contaminated with resin particles, is not susceptible to a contact failure, and can provide a good electrical connection with an external element having a low contact pressure.

What is claimed is:

1. A wiring substrate for electrical connection with a terminal of an external element, comprising:
   an insulating substrate;
   a metal wiring pattern formed on a surface of the insulating substrate; and
   an organic thin film of a thickness less than 5 μm which is formed on the insulating substrate to cover the metal wiring pattern and contains a polyester silane or a polyvinyl silane;
   wherein the metal wiring pattern is for electrical connection to the terminal of the external element through the organic thin film in a portion of the surface of the organic thin film that is to be in contact with the terminal of the external element.

2. The wiring substrate according to claim 1, wherein the metal wiring pattern is made of silver.

3. The wiring substrate according to claim 1, wherein the metal wiring pattern is made of gold.

4. The wiring substrate according to claim 1, wherein the metal wiring pattern includes a plurality of metal wiring lines spaced 5 μm or more apart.

* * * * *